United States Patent
Furukawa et al.

(10) Patent No.: US 7,217,629 B2
(45) Date of Patent: May 15, 2007

(54) EPITAXIAL IMPRINTING

(75) Inventors: Toshiharu Furukawa, Essex Junction, VT (US); Carl Radens, La Grangeville, NY (US); William R. Tonti, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 11/182,381

(22) Filed: Jul. 15, 2005

(65) Prior Publication Data
US 2007/0013001 A1    Jan. 18, 2007

(51) Int. Cl.
*H01L 21/762* (2006.01)
(52) U.S. Cl. .............. 438/355; 438/407; 257/347
(58) Field of Classification Search .............. 438/355, 438/407; 257/347
See application file for complete search history.

(56) References Cited

U.S. PATENT DOCUMENTS 7,060,585 B1 *   6/2006   Cohen et al. ............... 438/355

OTHER PUBLICATIONS

Yang, M., et al., "High Performance CMOS Fabricated on Hybrid Substrate With Different Crystal Orientations", IBM Semiconductor Research and Development Center, Yorktown Heights, NY.
Yang, M., et al., "On the Integration of CMOS with Hybrid Crystal Orientations", IBM Semiconductor Research and Development Center, Yorktown Heights, NY.

* cited by examiner

*Primary Examiner*—Edward Wojciechowicz
(74) *Attorney, Agent, or Firm*—Scully, Scott, Murphy & Presser, P.C.; Joseph P. Abate, Esq.

(57) ABSTRACT

The present invention provides an epitaxial imprinting process for fabricating a hybrid substrate that includes a bottom semiconductor layer; a continuous buried insulating layer present atop said bottom semiconductor layer; and a top semiconductor layer present on said continuous buried insulating layer, wherein said top semiconductor layer includes separate planar semiconductor regions that have different crystal orientations, said separate planar semiconductor regions are isolated from each other. The epitaxial printing process of the present invention utilizing epitaxial growth, wafer bonding and a recrystallization anneal.

11 Claims, 7 Drawing Sheets

EPITAXIAL IMPRINTING

FIELD OF THE INVENTION

The present invention relates to high-performance semiconductor devices for digital or analog applications, and more particularly to complementary metal oxide semiconductor (CMOS) devices that have mobility enhancement from surface orientation. Specifically, the present invention provides a hybrid oriented semiconductor substrate including multiple epitaxial materials on a monolithic planar wafer.

BACKGROUND OF THE INVENTION

In present semiconductor technology, CMOS devices, such as nFETs or pFETs, are typically fabricated upon semiconductor wafers, such as Si, that have a single crystal orientation. The term "FET" is used in the present application to denote a field effect transistor; the lower case 'n' and 'p' denote the conductivity of the transistor. In particular, most of today's semiconductor devices are built upon Si having a (100) crystal plane.

Electrons are known to have a high mobility for a (100) Si surface orientation, but holes are known to have a high mobility for a (110) surface orientation. That is, hole mobility values on (100) Si are roughly 2×–4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobility on (110) Si is 2× higher than on (100) Si; therefore, pFETs formed on a (110) surface will exhibit significantly higher drive currents than pFETs formed on a (100) surface. Unfortunately, electron mobility on (110) Si surfaces is significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Hybrid oriented substrates having planar surfaces with different crystallographic orientation have recently been developed. See, for example, U.S. patent application Ser. No. 10/250,241, filed Jun. 23, 2003. Additionally, hybrid-orientated metal oxide semiconductor field effect transistors (MOSFETs) have recently demonstrated significantly higher circuit performance at the 90 nm technology node. As discussed above, the electron mobility and hole mobility can be optimized independently by placing the nFET on a (100) surface and the pFET on a (110) surface.

In such technologies, the nFET is formed into a (100) SOI region of the hybrid substrate, while the pFET is formed into a (110) bulk-epi region. As is known to those skilled in the art, SOI devices generally have higher performance than bulk-like devices due to less parasitic capacitance. Hence, it is desirable to provide a semiconductor substrate that has separate SOI crystal orientations for both nFETs and pFETs.

In view of the above, there is a need to provide a hybrid substrate that has separate SOI regions with different crystal orientations.

SUMMARY OF THE INVENTION

The present invention provides a hybrid substrate that includes multiple SOI regions that have different crystal orientations by utilizing an epitaxial imprinting wafer bonding process. The inventive substrate provides separate SOI crystal orientations for both NFET and pFET devices such that the nFETs and pFETs are formed upon a crystal plane that provides the specific device with optimal device performance. Specifically, the nFETs are formed upon a (100) SOI crystal region, while the pFETs are formed upon a (110) SOI crystal region.

In broad terms, the present invention provides a hybrid substrate that comprises:

a bottom semiconductor layer;
a continuous buried insulating layer present atop said bottom semiconductor layer; and
a top semiconductor layer present on said continuous buried insulating layer, wherein said top semiconductor layer includes separate planar semiconductor regions that have different crystal orientations, said separate planar semiconductor regions are isolated from each other.

In accordance with the present invention, the separate semiconductor regions can be comprised of the same or different semiconductor material, such as Si, with the proviso that the crystal orientations of the separate semiconductor regions are different. For example, it is possible to provide a hybrid substrate the includes a bottom semiconductor layer, a continuous buried insulating layer on said bottom semiconductor layer and a top semiconductor layer that includes a first Si region having a first crystal orientation and a second Si region having a second crystal orientation that differs from the first.

The hybrid substrate described above can be used as a substrate in which CMOS devices, such as nFETS and pFETs, are formed into the separate semiconductor regions of different crystal orientation. In particular, the present invention provides an integrated semiconductor structure comprising:

a hybrid substrate including a top semiconductor layer located on a continuous buried insulating layer that separates said top semiconductor layer from a bottom semiconductor layer, wherein said top semiconductor layer includes separate planar semiconductor regions that have different crystal orientations, said separate planar semiconductor regions are isolated from each other; and at least one CMOS device located in each of the separate planar semiconductor regions of the top semiconductor layer, wherein each CMOS device is located on a crystal orientation that provides that device with optimal performance.

The CMOS devices employed are typically field effect transistors (FETs) in which nFETs are located in a semiconductor region of the top semiconductor layer having a (100) crystal orientation and pFETs are located in another semiconductor region of the top semiconductor layer having a (110) crystal orientation.

The present invention also provides methods of forming the above mentioned hybrid substrate that includes a combination of epitaxial imprinting and wafer bonding. Specifically, one of the methods of the present invention that is used in forming the above mentioned hybrid substrate comprises:

providing a structure comprising a bottom semiconductor layer, a continuous buried insulating layer on said bottom semiconductor layer, a top semiconductor layer of a first crystal orientation on a portion of said continuous buried insulating layer and a pad stack located on said patterned top semiconductor layer, wherein said structure includes at least one semiconductor region in an opening provided in said pad stack and said top semiconductor layer that is in contact with a portion of said continuous buried insulating layer;

bonding said structure to a second substrate having a second crystal orientation that differs from said first crystal orientation and including a damaged region, wherein said pad stack and said at least one semiconductor region contact a surface of said second substrate;

removing a portion of said second substrate at said damaged region;

recrystallizing said at least one semiconductor region into a recrystallized semiconductor having said second crystal orientation; and removing said remaining second substrate and said pad stack to provide a hybrid substrate having said top semiconductor layer that includes separate planar semiconductor regions of different crystal orientation on said continuous buried insulating layer.

In an alternative embodiment to the above-described method, the pad stack can be thinned prior to bonding said first substrate to said second substrate.

Another method that can be used in the present invention in providing the hybrid substrate includes:

providing a structure comprising a bottom semiconductor layer, a continuous buried insulating layer on said bottom semiconductor layer, a top semiconductor layer of a first crystal orientation on a portion of said continuous buried insulating layer and a pad stack located on said patterned top semiconductor layer, wherein said structure includes at least one semiconductor region in an opening provided in said pad stack and said top semiconductor layer that is in contact with a portion of said continuous buried insulating layer;

bonding said structure to a second substrate having a second crystal orientation that differs from said first crystal orientation and including a damaged region, wherein said pad stack and said at least one semiconductor region contact a surface of said second substrate;

recrystallizing said at least one semiconductor region into a recrystallized semiconductor having said second crystal orientation;

removing a portion of said second substrate at said damaged region; and removing remaining second substrate and said pad stack to provide a hybrid substrate having said top semiconductor layer that includes separate planar semiconductor regions of different crystal orientation on said continuous buried insulating layer.

DETAILED DESCRIPTION OF THE INVENTION

Figure 1A:
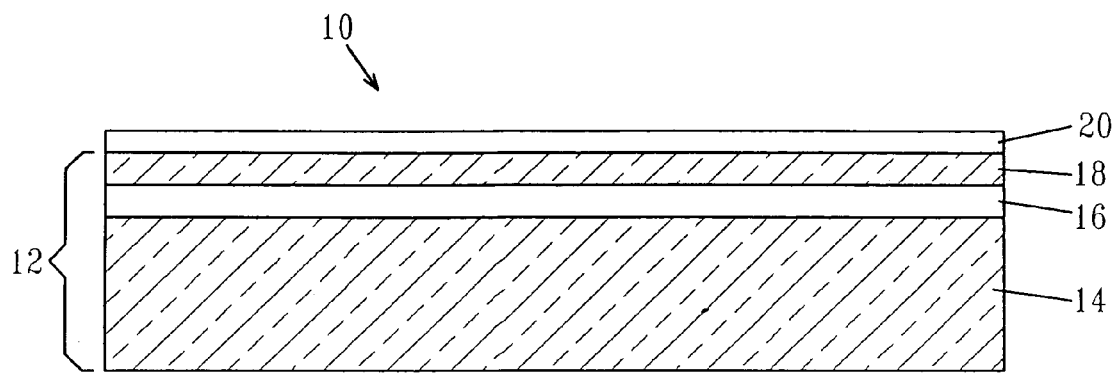
FIGS. 1A–1I are pictorial representations (through cross sectional views) illustrating the basic processing steps of one of the embodiments of the present invention.

The present invention, which provides a hybrid substrate that includes multiple orientations of SOI and methods of fabricating the hybrid substrate, will now be described in greater detail by referring to the drawings that accompany the present application. It is noted that the drawings of the present application are provided for illustrative purposes only and thus they are not drawn to scale.

Reference is first made to FIGS. 1A–1I which illustrate (through cross sectional views) one of the embodiments of the present invention in which epitaxial imprinting and wafer bonding are used in forming a hybrid substrate that includes separate planar semiconductor regions that have different crystal orientations. FIG. 1A illustrates an initial structure 10 that is employed in the present invention. The initial structure 10 includes a first substrate 12 that is comprised of a bottom semiconductor layer 14, a continuous buried insulating layer 16, and a top semiconductor layer 18.

The bottom and top semiconductor layers 14 and 18 may be comprised of the same or different semiconductor material. Illustrative examples of semiconductor materials that can be used as layers 14 and 18 include, but are not limited to: Si, SiC, SiGe, SiGeC, InAs, InAs, Ge, GaAs, and other III/V and II/VI compound semiconductors. Each semiconductor layer 14 and 18 of the first substrate 12 may also be comprised of a combination (i.e., multilayered stack) of semiconductor materials. The semiconductor layers 14 and 18 may be independently strained, unstrained, or include materials with different doping, or different bandgaps, or a combination thereof.

The semiconductor layers 14 and 18 may have the same or different crystal orientation, with the same being more highly preferred. The crystal orientations of the semiconductor layers 14 and 18 can include any major or minor Miller Index. Typically, the semiconductor layers 14 and 18 are Si-containing semiconductor materials (such as Si or SiGe) and the crystal orientation of the layers is one of (100), (110) or (111), with (100) or (110) being most preferred.

The thickness of the bottom semiconductor layer 14 of the first substrate 12 may vary and is inconsequential to the present invention. Typically, and for illustrative purposes only, the bottom semiconductor layer 14 of the first substrate 12 has a thickness from about 50 nm to about 5 μm. The thickness of the top semiconductor layer 18 of the first substrate 12 may vary depending upon the technique that was used in processing the first substrate 12. Typically, the thickness of the top semiconductor layer 18 is from about 10 nm to about 200 nm. If the top semiconductor layer 18 is greater than the above-mentioned range, the top semiconductor layer 18 may be subjected to a thinning process prior to forming pad stack 20 thereon. The thinning of the top semiconductor layer 18 may be performed by planarization, grinding, wet etching or dry etching. In some embodiments of the present invention, the top semiconductor layer 18 may be thinned by a combination of oxidation and wet etching.

The continuous buried insulating layer 16 that separates the top semiconductor layer 18 from the bottom semiconductor layer 14 may be comprised of a crystalline or non-crystalline oxide, nitride or a combination thereof. Preferably, the buried insulating layer 16 is comprised of an oxide. The thickness of the buried insulating layer 16 may vary depending upon the technique that was used in forming the same. Typically, the continuous buried insulating layer 16 has a thickness from about 50 nm to about 500 nm, with a thickness from about 100 to about 200 nm being even more typical.

The first substrate 12 shown in FIG. 1A may be formed by utilizing conventional techniques that are well known to those skilled in the art. For example, the first substrate 12 may be formed by implantation and annealing (e.g., SIMOX, separation by ion implantation of oxygen) or a bonded layer transfer process. Alternatively, the first substrate 12 can be formed by first forming the buried insulating layer 16 on the surface of the bottom semiconductor layer 14 by a conventional deposition process or by a thermal growth process, followed by deposition of the top semiconductor layer 18.

After providing the first substrate 12, a pad stack 20 is formed on the upper surface of the first substrate 12, i.e., on an exposed surface of the top semiconductor layer 18; See FIG. 1A as well. The pad stack 20 may comprise an oxide, a nitride, an oxynitride or any combination thereof (e.g., an oxide-nitride stack). Typically, the pad stack 20 is comprised of a nitride.

The pad stack 20 can be formed by utilizing any conventional deposition process including, for example, chemical vapor deposition (CVD), plasma enhanced chemical vapor deposition (PECVD), atomic layer deposition (ALD), chemical solution deposition, evaporation and other like deposition processes. Alternatively, the pad stack 20 can be formed by utilizing thermal oxidation, thermal nitridation or thermal oxynitridation. Combinations of the aforementioned techniques may also be used in forming the pad stack 20. The thickness of the pad stack 20 may vary depending upon the number of material layers present in the stack and the technique that was used in forming the same. Typically, the pad stack 20 has a total thickness from about 5 nm to about 500 nm, with a total thickness from about 100 to about 200 nm being even more typical.

After providing the structure 10 shown in FIG. 1A, a photoresist (not shown) is formed on a surface of the pad stack 20 and the photoresist is patterned by a lithographic step which includes exposing the resist to a desired pattern of radiation and developing the exposed resist with a conventional resist developer. After lithography, the pattern is transferred from the resist into the pad stack 20 and then into the underlying top semiconductor layer 18 so as to provide the structure shown, for example, in FIG. 1B. As shown, at least one opening 22 is formed in this step of the present invention which exposes a surface portion of the buried insulating layer 16. The patterned resist can be removed once the pattern has been transferred into the pad stack 20, or alternatively after complete pattern transfer utilizing a conventional resist stripping process.

The pattern transfer step described above is performed utilizing one or more etching processes, including dry etching (reactive-ion etching, ion beam etching, laser ablation or plasma etching), wet chemical etching or any combination thereof.

It is emphasized that more that one opening 22 can be formed at this step of the present invention to provide a structure in which a plurality of openings 22 have been formed through the pad stack 20 and the top semiconductor layer 18.

Figure 1B:
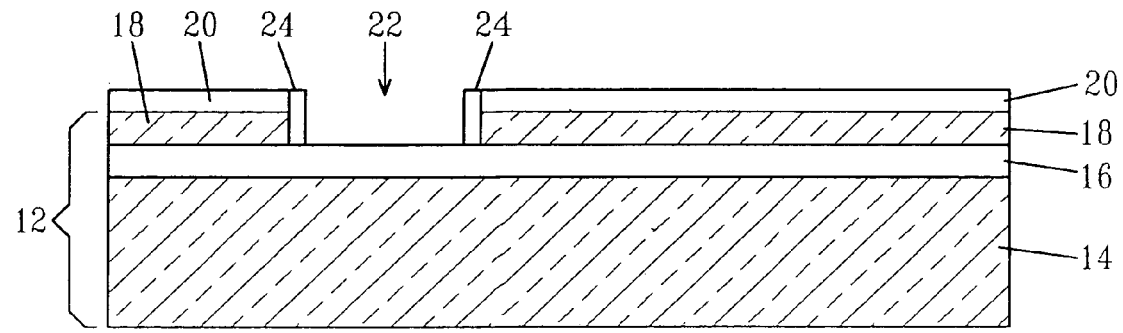

After providing at least one opening 22 into the structure shown in FIG. 1A, a liner 24 is formed at least on the exposed vertical sidewalls of the top semiconductor layer 18 within the opening 22 as is also shown in FIG. 1B. The liner 24 comprises an insulating material such as, for example, an oxide, a nitride or an oxynitride, with oxide liners being particularly preferred. The liner 24 can be formed by deposition and anisotropic etching, or more typically, a thermal process such as thermal oxidation is used in forming the liner 24 within the opening 22. The liner 24 is typically a thin layer whose thickness is within the range from about 5 nm to about 50 nm.

Figure 1C:
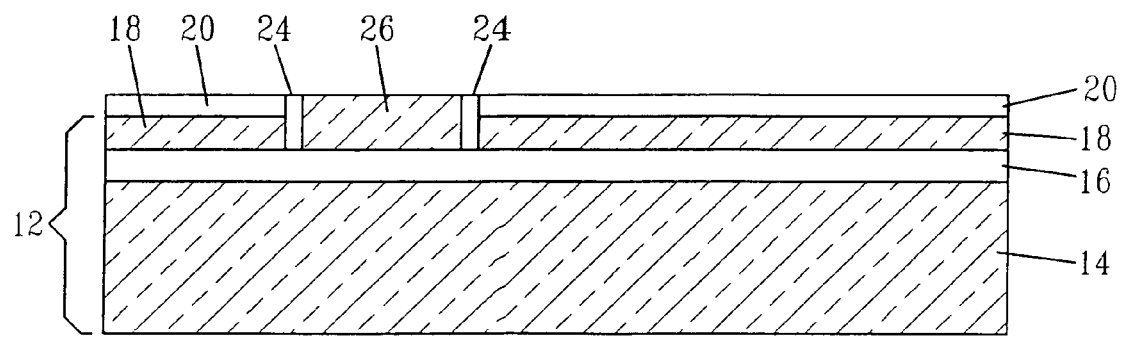

Next, an epitaxial semiconductor layer comprising an amorphous semiconductor material or a polycrystalline semiconductor material, or microcrystalline semiconductor material such as, in particular a:Si or polySi, (hereinafter semiconductor layer 26) is formed on the structure shown in FIG. 1B utilizing a conventional deposition process that is capable of filling the opening 22 with said semiconductor layer 26. The semiconductor material used in filling the at least one opening 22 may be the same or different semiconductor material as that of the top semiconductor layer 18, with Si-containing semiconductor materials being highly preferred for use as the layer 26. Depending upon the exact conditions of the deposition, and the thickness and patterned widths of layers 18, 24 and 20, portions of the semiconductor layer 26 will extend above the opening 22, and along the surface of layer 20. In embodiments in which the semiconductor layer 26 extends above the opening 22, a planarization process such as chemical mechanical polishing (CMP) and/or grinding may be employed to provide a planar structure such as shown in FIG. 1C. Note that in FIG. 1C the semiconductor layer 26 has an upper surface that is coplanar with that of an upper surface of pad stack 20.

Figure 1D:
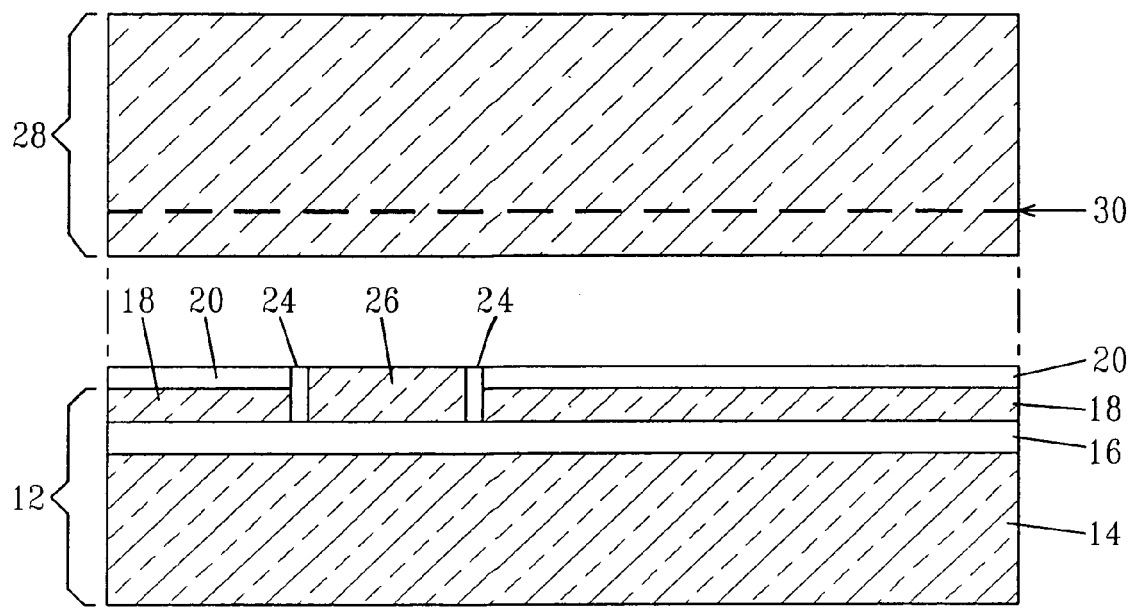

Next, and as shown in FIG. 1D, a second substrate 28 including a damaged region 30 is provided and is brought into proximity to the planar structure shown in FIG. 1C. The second substrate 28 may comprise the same or different semiconductor material as the top semiconductor layer 18, with Si-containing semiconductors being highly preferred. The second substrate 28 is comprised of a crystalline material which will have a lattice constant which will be imparted on layer 26, and hence will preferably be comprised of the same material as layer 26. Another feature of the second substrate 28 is that it has a crystal orientation that differs from that of the top semiconductor layer 18 of the first substrate 12. That is, if the top semiconductor layer 18 of the first substrate 12 has a first crystal orientation, then the second substrate 28 has a second crystal orientation that differs from the first. For example, the top semiconductor layer 18 may have a (100) crystal orientation, and the second substrate 28 may have a (110) crystal orientation. Alternatively, the top semiconductor layer 18 may have a (110) crystal orientation and the second substrate 28 has a (100). Note that the crystal orientation of the second substrate 28 is used in determining the crystal orientation of the semiconductor layer 26 in a subsequent recrystallization anneal.

The damaged region 30 is formed by ion implanting hydrogen or another like ion into the second substrate 28. The ion implantation process, which is used in creating the damaged region 30 into the second substrate 28, is well known to those skilled in the art and includes any that are capable of forming said damaged region 30.

The two substrates (12 and 28) shown in FIG. 1D are then joined, i.e., bonded, by first bringing the two substrates (12 and 28) into intimate contact with each other such that surface of the pad stack 20 contacts a surface of the second substrate 28 that is closest to the damaged region 30, optionally applying an external force to the contacted substrates, and annealing the two contacted substrates under conditions that are sufficient of increasing the bond energy between the two substrates. The annealing step may be performed in the presence or absence of an external force.

Figure 1E:
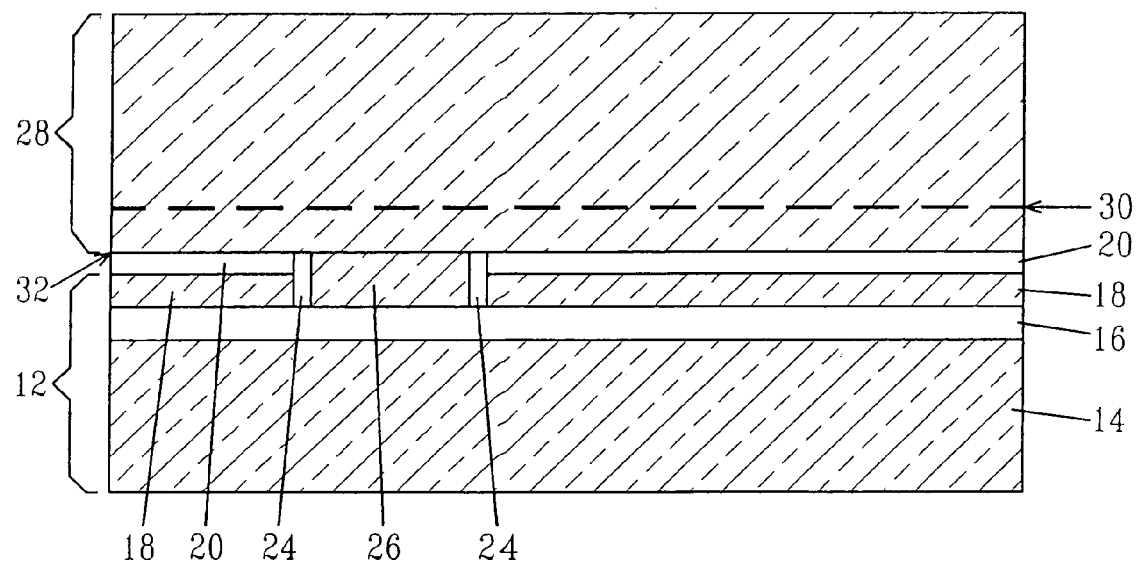

Moreover, the annealing step is performed at a temperature from about 200° to about 1050° C. for a time period from about 2 to about 20 hours. More typically, the annealing is performed at a temperature from about 200° to about 400° C. for a time period from about 2 to about 10 hours. The temperatures provided above are exemplary and other ranges above or below those specifically stated herein are also contemplated. For example, annealing at nominal room temperature (20°–40° C.) is also contemplated herein. Notwithstanding the temperature of the annealing step, the anneal step is typically performed in the presence of an inert ambient such as, for example, in an atmosphere comprising at least one of He, Ar, $N_2$, Xe or Kr. A preferred inert ambient is $N_2$. The bonded structure including the two substrates 12 and 28 is shown in FIG. 1E. Reference numeral 32 represents the bonded interface.

In the embodiment illustrated, the annealing step causes the damaged region 30 present within the second substrate 28 to become porous such that it can be removed from the bonded structure by subjecting the same to a splitting anneal that takes place after the bonding anneal. The splitting anneal is typically performed at a temperature from about 350° to 500° C. in an inert ambient. After the splitting anneal, the portion of the semiconductor substrate 28 above the damaged region 30 that is distal from the bonded interface 32 is removed providing the structure, shown, for example, in FIG. 1F. It is noted that in FIG. 1F a portion of the second substrate 28 that has a different crystal orientation from that of the top semiconductor layer 18 of the first substrate 12 remains. The remaining portion of the second substrate 28 is in contact with the semiconductor layer 26 that is within the opening 22.

Figure 1F:
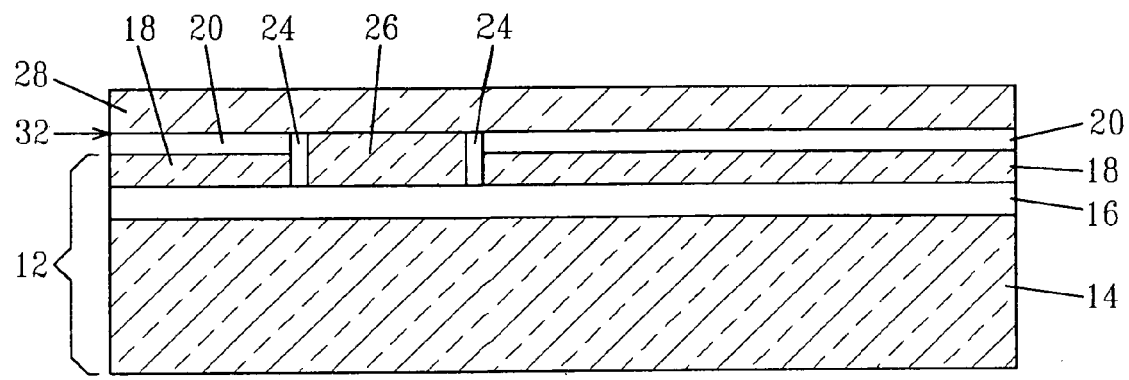

After performing the splitting anneal, the structure shown in FIG. 1F is subjected to a recrystallization annealing step. The recrystallization anneal is performed at a temperature from about 200° to about 1300° C., preferably from about 400° to about 900° C. for a time period that is sufficient to bring about the desired recrystallization. This time period will depend on the orientation of the remaining portion of the second substrate 28, on the thickness of the semiconductor layer 26, and the presence of implants and other impurities within the semiconductor layer 26. The recrystallization anneal may be performed in a furnace, by rapid thermal annealing, by laser annealing or by a spike anneal. The annealing ambient would typically be selected from the group of gases including $N_2$, Ar, He, $H_2$ and mixtures thereof. Additional post-recrystallization anneals (typically at the high end of the temperature range mentioned above) may also be performed.

During recrystallization, the semiconductor layer 26 is recrystallized into an epi semiconductor layer that has the same orientation as that of the remaining second substrate 28. Hence, the recrystallized semiconductor layer 26' has the second crystal orientation, which is different from the first crystal orientation of the top semiconductor layer 18. The resultant structure that is formed after this step has been performed is shown, for example, in FIG. 1G.

Figure 1G:
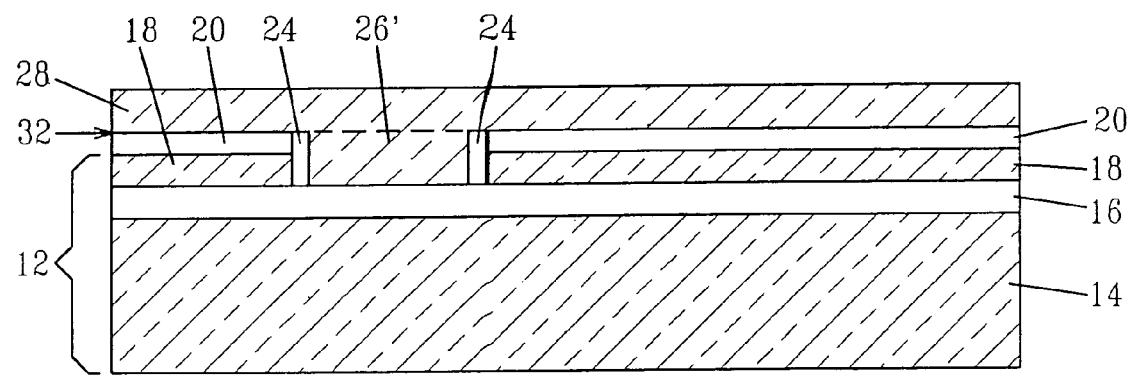

After the recrystallization anneal, the structure shown in FIG. 1G is planarized utilizing a conventional planarization process such as CMP or grinding or by oxidation and etching to remove the remaining portion of the semiconductor substrate 28 from the structure. Thereafter, the pad stack 20 remaining on the structure is removed providing the structure shown in FIG. 1H. The hybrid substrate illustrated in FIG. 1H includes, in broad terms, the bottom semiconductor layer 14, the continuous buried insulating layer 16 present atop the bottom semiconductor layer 14, and the top semiconductor layer 18 present on the continuous buried insulating layer 16, wherein the top semiconductor layer 18 includes separate planar semiconductor regions (18 and 26') that have different crystal orientations, said separate planar semiconductor regions are isolated from each other by liner 24.

Figure 1H:
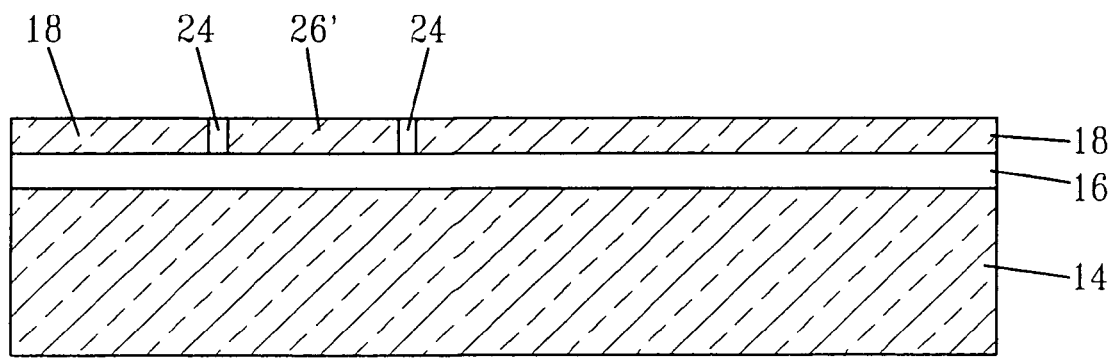
Figure 1I:
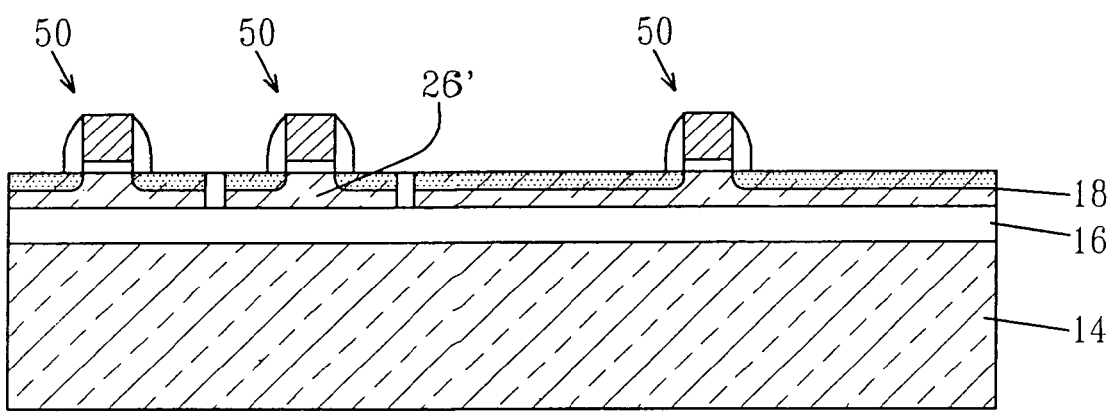

FET devices (see, FIG. 11) 50 can then be fabricated on the hybrid substrate shown in FIG. 1H utilizing techniques that are well known to those skilled in the art. Specifically, nFETs and pFETs are formed upon one of the separate semiconductor regions of different crystal orientation mentioned above such that each FET device is located on a crystal surface that provides that device with optimal performance. That, is nFETs are formed on a (100) crystal surface and pFETs are formed upon a (110) crystal surface. Each FET device includes a gate dielectric, a gate conductor, a sidewall spacer, and source/drain regions.

Figure 2A:
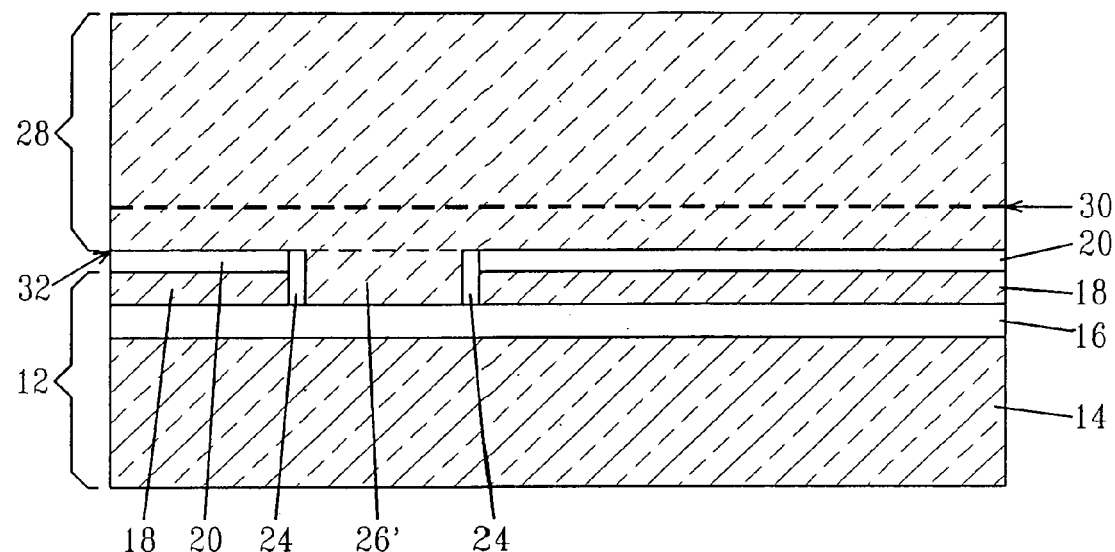
FIGS. 2A–2C are pictorial representations (through cross sectional views) illustrating the basic processing steps of another embodiment of the present invention.
Figure 2B:
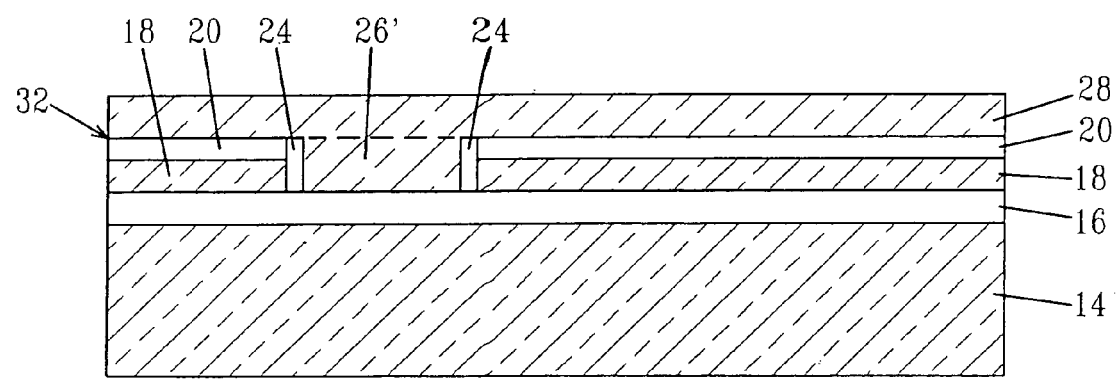
Figure 2C:
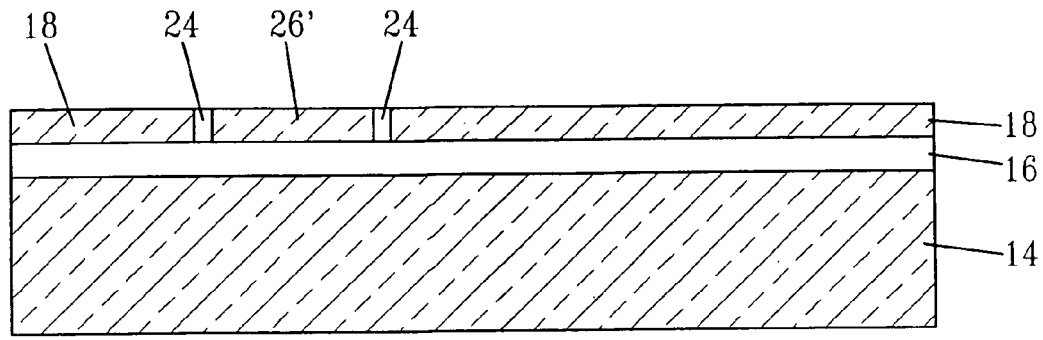

FIGS. 2A–2C illustrate a second embodiment of the present invention that can be used in forming the inventive hybrid substrate. Specifically, the processing steps as described above in providing the structure shown FIG. 1E are first performed so as to provide the bonded structure in that drawing. After the two substrates 12 and 28 have been joined as described above, the bonded structure is subjected to the recrystallization anneal described above so as to provide the structure shown in FIG. 2A. As was the case in the first embodiment, the recrystallization anneal converts the semiconductor layer 26 into a recrystallized semiconductor layer 26' having the same crystal orientation as that of the second substrate 28.

The structure shown in FIG. 2A is then subjected to the splitting anneal described above so as to provide the structure shown in FIG. 2B. Following the splitting anneal step, the structure is planarized and the pad stack 20 is removed as described above providing the structure shown in FIG. 2C. The hybrid substrate that results from the second embodiment of the present invention also includes the bottom semiconductor layer 14, the continuous buried insulating layer 16 present atop the bottom semiconductor layer 14, and the top semiconductor layer 18 present on the continuous buried insulating layer 16, wherein the top semiconductor layer 18 includes separate planar semiconductor regions (18 and 26') that have different crystal orientations, said separate planar semiconductor regions are isolated from each other by liner 24. FET devices as described above can also be formed on this substrate as well.

Figure 3A:
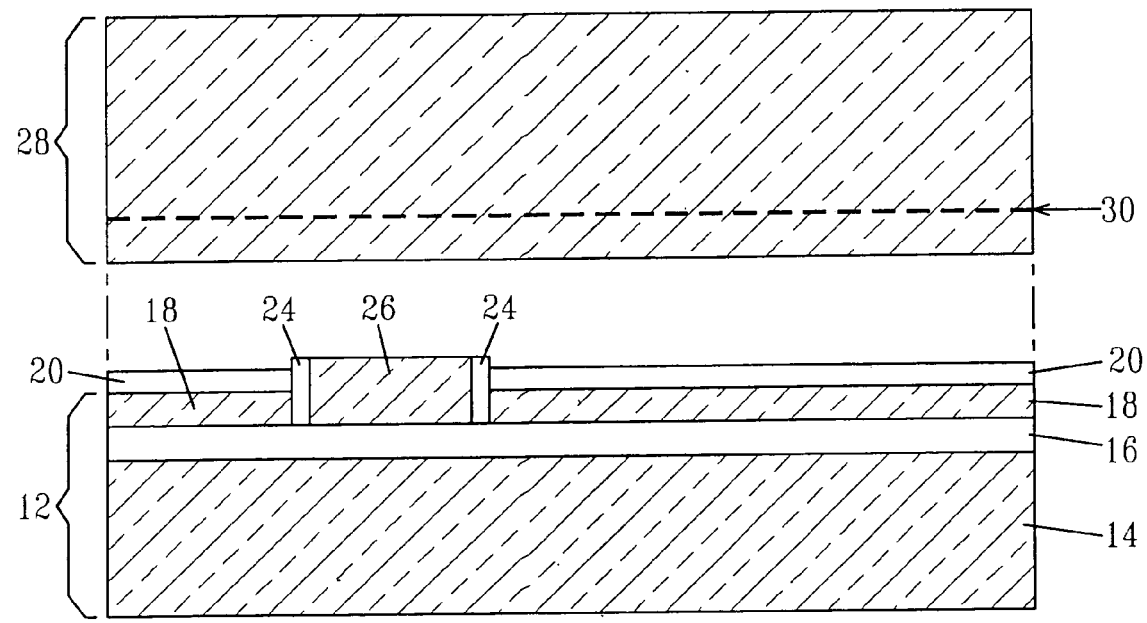
FIGS. 3A–3B are pictorial representations (through cross sectional views) illustrating the basic processing steps of yet another embodiment of the present invention.
Figure 3B:
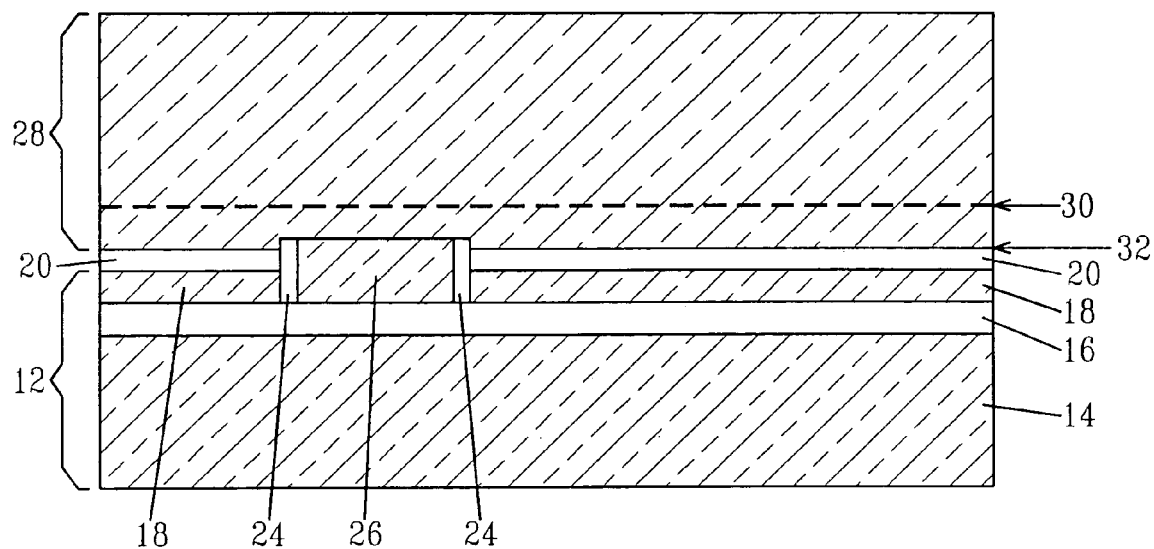

FIGS. 3A–3B show yet another embodiment of the present invention. In this embodiment, the structure shown in FIG. 1C is first provided as described above. At this point of the process, the pad stack 20 is thinned utilizing oxidation and etching or any other like etching process that can be used in thinning the pad stack 20. Note that this step of the present invention thins the pad stack 20 below the upper surface of the semiconductor layer 26 as well as the liner 24. This structure is shown in FIG. 3A as well as the second substrate 28 including the damaged region 30. The substrates 12 and 28 are then joined as described above and the processing steps as described in the first embodiment, after the bonding process has been performed, are used in this alternative embodiment as well. The final hybrid substrate looks the same as that shown in FIG. 1H.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:

providing a structure comprising a bottom semiconductor layer, a continuous buried insulating layer on said bottom semiconductor layer, a top semiconductor layer of a first crystal orientation on a portion of said continuous buried insulating layer and a pad stack located on said patterned top semiconductor layer, wherein said structure includes at least one semiconductor region in an opening provided in said pad stack and said top semiconductor layer that is in contact with a portion of said continuous buried insulating layer;

bonding said structure to a second substrate having a second crystal orientation that differs from said first crystal orientation and including a damaged region, wherein said pad stack and said at least one semiconductor region contact a surface of said second substrate;

removing a portion of said second substrate at said damaged region;

recrystallizing said at least one semiconductor region into a recrystallized semiconductor having said second crystal orientation; and removing said remaining second substrate and said pad stack to provide a hybrid substrate having said top semiconductor layer that includes separate planar semiconductor regions of different crystal orientation on said continuous buried insulating layer.

2. The method of claim 1 further comprising thinning said pad stack prior to bonding.

3. The method of claim 1 wherein said providing said structure comprises forming a first substrate comprising said bottom semiconductor layer, said continuous buried insulating layer and said top semiconductor layer; forming a pad stack on an upper surface of said first substrate; providing at least one opening in said pad stack and said top semiconductor layer by lithography and etching, and filling said at least one opening with an amorphous or polycrystalline semiconductor material by epitaxy.

4. The method of claim 1 wherein said bonding comprises bringing said structure and said second substrate into intimate contact with each other, optionally applying an external force to said contacted structure and annealing.

5. The method of claim 1 wherein said removing a portion of said second substrate comprises a splitting anneal.

6. The method of claim 1 wherein said recrystallizing is performed at a temperature from about 200° to about 1300° C. in an ambient including at least one of $N_2$, Ar, He or $H_2$.

7. A method of fabricating a hybrid substrate comprising:

providing a structure comprising a bottom semiconductor layer, a continuous buried insulating layer on said bottom semiconductor layer, a top semiconductor layer of a first crystal orientation on a portion of said continuous buried insulating layer and a pad stack located on said patterned top semiconductor layer, wherein said structure includes at least one semiconductor region in an opening provided in said pad stack and said top semiconductor layer that is in contact with a portion of said continuous buried insulating layer;

bonding said structure to a second substrate having a second crystal orientation that differs from said first crystal orientation and including a damaged region, wherein said pad stack and said at least one semiconductor region contact a surface of said second substrate;

recrystallizing said at least one semiconductor region into a recrystallized semiconductor having said second crystal orientation;

removing a portion of said second substrate at said damaged region; and removing remaining second substrate and said pad stack to provide a hybrid substrate having said top semiconductor layer that includes separate planar semiconductor regions of different crystal orientation on said continuous buried insulating layer.

8. The method of claim 7 wherein said providing said structure comprises forming a first substrate comprising said bottom semiconductor layer, said continuous buried insulating layer and said top semiconductor layer; forming a pad stack on an upper surface of said first substrate; providing at least one opening in said pad stack and said top semiconductor layer by lithography and etching, and filling said at least one opening with an amorphous or polycrystalline semiconductor material by epitaxy.

9. The method of claim 7 wherein said bonding comprises bring said structure and said second substrate into intimate contact with each other, optionally applying an external force to said contacted structure and annealing.

10. The method of claim 7 wherein said removing a portion of said second substrate comprises a splitting anneal.

11. The method of claim 7 wherein said recrystallizing is performed at a temperature from about 200° to about 1300° C. in an ambient including at least one of $N_2$, Ar, He or $H_2$.

* * * * *